United States Patent
Liu et al.

(10) Patent No.: US 12,532,529 B2
(45) Date of Patent: Jan. 20, 2026

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Jun-Ye Liu, Hsinchu (TW); Jih-Sheng Yang, Hsinchu (TW); Yu-Hsien Lin, Hsinchu (TW); Ryan Chia-Jen Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 401 days.

(21) Appl. No.: 18/170,387

(22) Filed: Feb. 16, 2023

(65) Prior Publication Data

US 2024/0105795 A1 Mar. 28, 2024

Related U.S. Application Data

(60) Provisional application No. 63/410,423, filed on Sep. 27, 2022.

(51) Int. Cl.
*H10D 64/27* (2025.01)
*H01L 21/28* (2025.01)
(Continued)

(52) U.S. Cl.
CPC ..... *H10D 64/518* (2025.01); *H01L 21/28088* (2013.01); *H01L 21/28114* (2013.01);
(Continued)

(58) Field of Classification Search
CPC ............... H10D 64/518; H10D 64/667; H10D 30/6211; H10D 64/017; H10D 30/024; H01L 21/28088; H01L 21/28114
See application file for complete search history.

(56) References Cited

U.S. PATENT DOCUMENTS

2020/0335595 A1* 10/2020 Huang ................. H10D 64/017
2021/0159326 A1* 5/2021 Hsiao ................ H01L 21/76877
(Continued)

FOREIGN PATENT DOCUMENTS

CN 1822338 A 8/2006
TW 200919726 A 5/2007
(Continued)

OTHER PUBLICATIONS ip.com search history . (Year: 2025).*
Office Action issued in connection with Taiwan Appl. No. 112113385 dated Dec. 4, 2024.

*Primary Examiner* — Zandra V Smith
*Assistant Examiner* — Andre C Stevenson
(74) *Attorney, Agent, or Firm* — FOLEY & LARDNER LLP

(57) ABSTRACT

A method for fabricating semiconductor devices is disclosed. The method includes forming a gate trench over a semiconductor channel, the gate trench being surrounded by gate spacers. The method includes sequentially depositing a work function metal, a glue metal, and an electrode metal in the gate trench. The method includes etching respective portions of the electrode metal and the glue metal to form a gate electrode above a metal gate structure. The metal gate structure includes a remaining portion of the work function metal and the gate electrode includes a remaining portion of the electrode metal. The gate electrode has an upper surface extending away from a top surface of the metal gate structure.

20 Claims, 16 Drawing Sheets

(51) Int. Cl.
*H10D 30/01* (2025.01)
*H10D 30/62* (2025.01)
*H10D 64/01* (2025.01)
*H10D 64/66* (2025.01)

(52) U.S. Cl.
CPC ....... *H10D 30/024* (2025.01); *H10D 30/6211* (2025.01); *H10D 64/017* (2025.01); *H10D 64/667* (2025.01)

(56) References Cited

U.S. PATENT DOCUMENTS

2021/0242324 A1* 8/2021 Yao .................. H10D 64/017
2021/0272972 A1* 9/2021 Young ............... H10D 30/024

FOREIGN PATENT DOCUMENTS

TW 201639099 A 11/2016
TW 202129723 A 8/2021

* cited by examiner

SEMICONDUCTOR DEVICES AND METHODS OF MANUFACTURING THEREOF

CROSS-REFERENCE TO RELATED APPLICATIONS

This application claims priority to and the benefit of U.S. Provisional Patent App. No. 63/410,423, filed Sep. 27, 2022, the entire disclosure of which is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
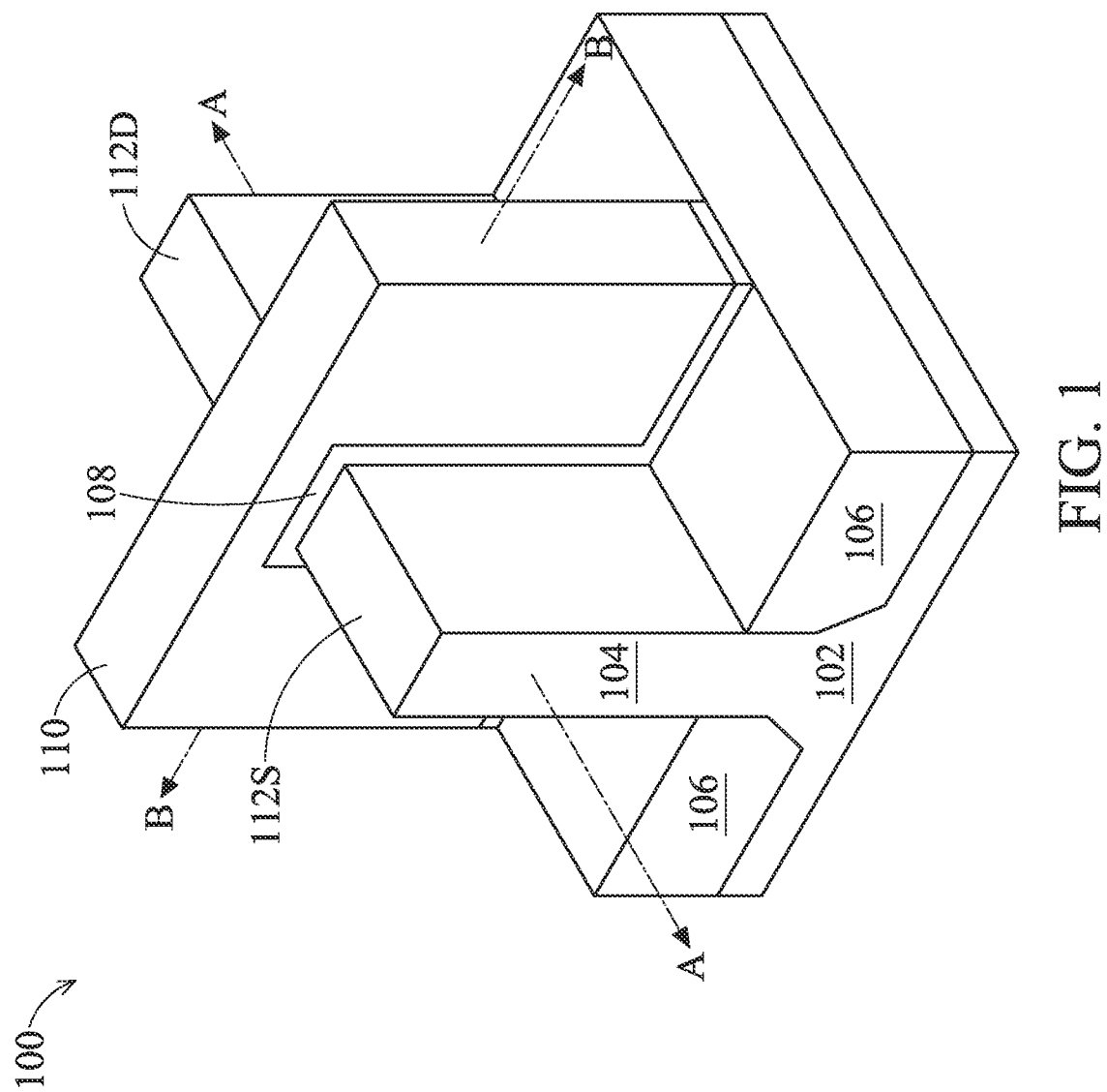
FIG. 1 illustrates a perspective view of a fin field-effect transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, the active (e.g., metal) gate structure of a transistor device (e.g., a FinFET, a gate-all-around (GAA) transistor, etc.) can be formed by replacing a dummy (e.g., polysilicon) gate structure. In order to allow the metal gate structure to electrically connect to one or more other features, a gate electrode is typically formed over the metal gate structure. In existing technologies, such a gate electrode is formed by recessing a top portion of the metal gate structure, followed by filling the recessed portion with a gate electrode metal. While dimensions of the resultant transistor device continue to shrink, filling the recessed portion can become increasingly challenging. Thus, the existing technologies for forming the gate electrode of a transistor device have not been entirely satisfactory in many aspects.

The present disclosure provides various embodiments of a transistor device that has its gate electrode formed without the above-identified issues. In some embodiments, a gate trench can be first formed over a channel region (e.g., a fin structure, a stack of alternately arranged first and second semiconductor layers). Next, the gate trench can be sequentially filled with a gate dielectric, a work function metal, a glue metal, and an electrode metal. By utilizing an etching process, the electrode metal can be patterned to form a gate electrode in a "crown" shape that protrudes out of a metal gate structure, which is mainly formed by remaining portions of the gate dielectric and work function metal. With the gate electrode formed sequentially with the layers of the metal gate structure, the above-identified issue (e.g., the challenge to refill a relatively narrow space with electrode metal) can be advantageously avoided. As such, various corresponding characteristics of the resultant transistor structure (e.g., an effective gate resistance sometimes referred to as "Rg") can be significantly improved.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source/drain regions 112D and 112S are in the fin 104 and on opposing sides of the gate dielectric 108 and the gate 110. The source/drain regions 112D and 112S extend outward from the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
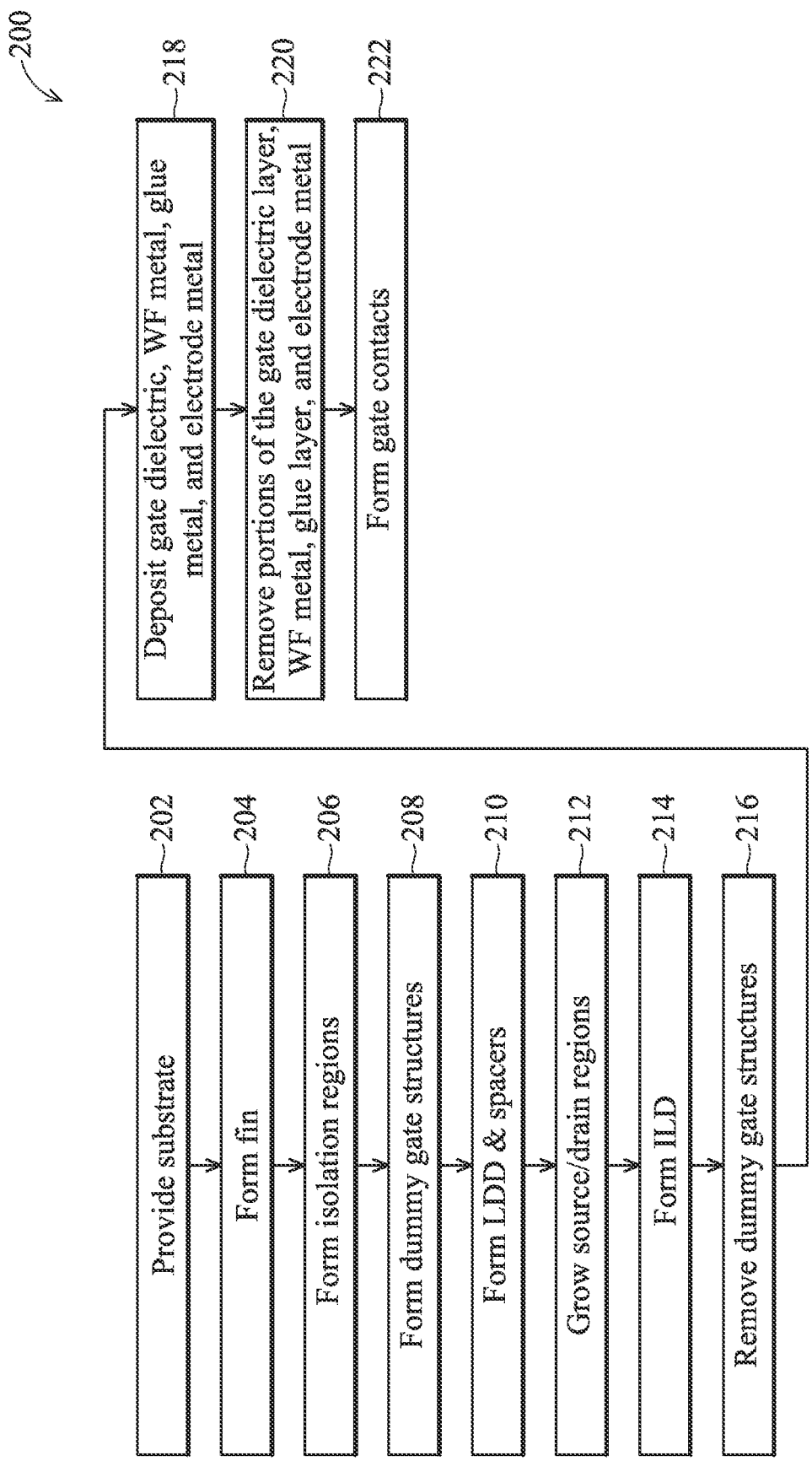
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations of the method 200 can be used to form a FinFET device (e.g., FinFET device 100), a nanosheet transistor device, a gate-all-around transistor device, a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14, 15, and 16, respectively, which will be discussed in further detail below.

In brief overview, the method 200 starts with operation 202 of providing a substrate. The method 200 continues to operation 204 of forming a fin. The method 200 continues to operation 206 of forming isolation regions. The method 200 continues to operation 208 of forming dummy gate structures. The dummy gate structures may straddle a (e.g., central) portion of the fin, with other (e.g., side) portions of the fin exposed. The method 200 continues to operation 210 of forming lightly doped drain (LDD) regions and gate spacers. The gate spacers may extend along sidewalls of the dummy gate structure, respectively. The method 200 continues to operation 212 of growing source/drain regions. The method 200 continues to operation 214 of forming an interlayer dielectric (ILD). The method 200 continues to operation 216 of removing the dummy gate structures. Upon the dummy gate structure being removed, the overlaid portion of the corresponding fin can be re-exposed. The method 200 continues to operation 218 of depositing a gate dielectric, a work function metal, a glue metal, and an electrode metal. The method 200 continues to operation 220 of removing portions of the electrode metal, the glue metal, the work function metal, and the gate dielectric. The method 200 continues to operation 222 of forming gate contacts.

As mentioned above, FIGS. 3-16 each illustrates, in a cross-sectional view, a portion of a FinFET device 300 at various fabrication stages of the method 200 of FIG. 2. The FinFET device 300 is substantially similar to the FinFET device 100 shown in FIG. 1, but with multiple gate structures. For example, FIGS. 3-6 illustrate cross-sectional views of the FinFET device 300 along cross-section B-B (as indicated in FIG. 1); and FIGS. 7-16 illustrate cross-sectional views of the FinFET device 300 along cross-section A-A (as indicated in FIG. 1). Although FIGS. 3-16 illustrate the FinFET device 300, it is understood the FinFET device 300 may include a number of other devices such as inductors, fuses, capacitors, coils, etc., which are not shown in FIGS. 3-16, for purposes of clarity of illustration.

Figure 3:
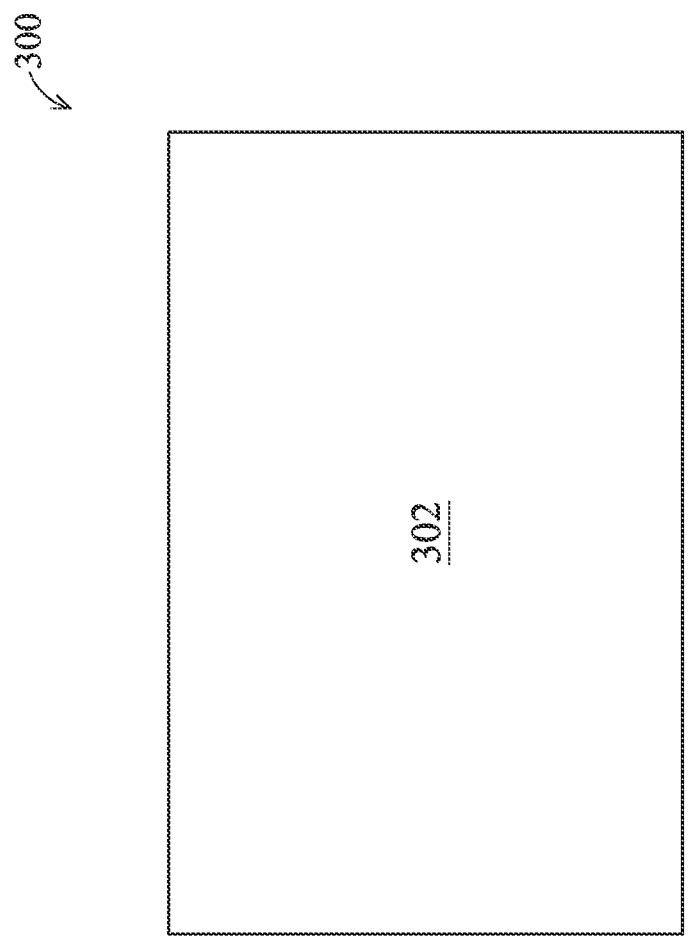
FIGS. 3, 4, 5, 6, 7, 8, 9, 10, 11, 12, 13, 14, 15, and 16 illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
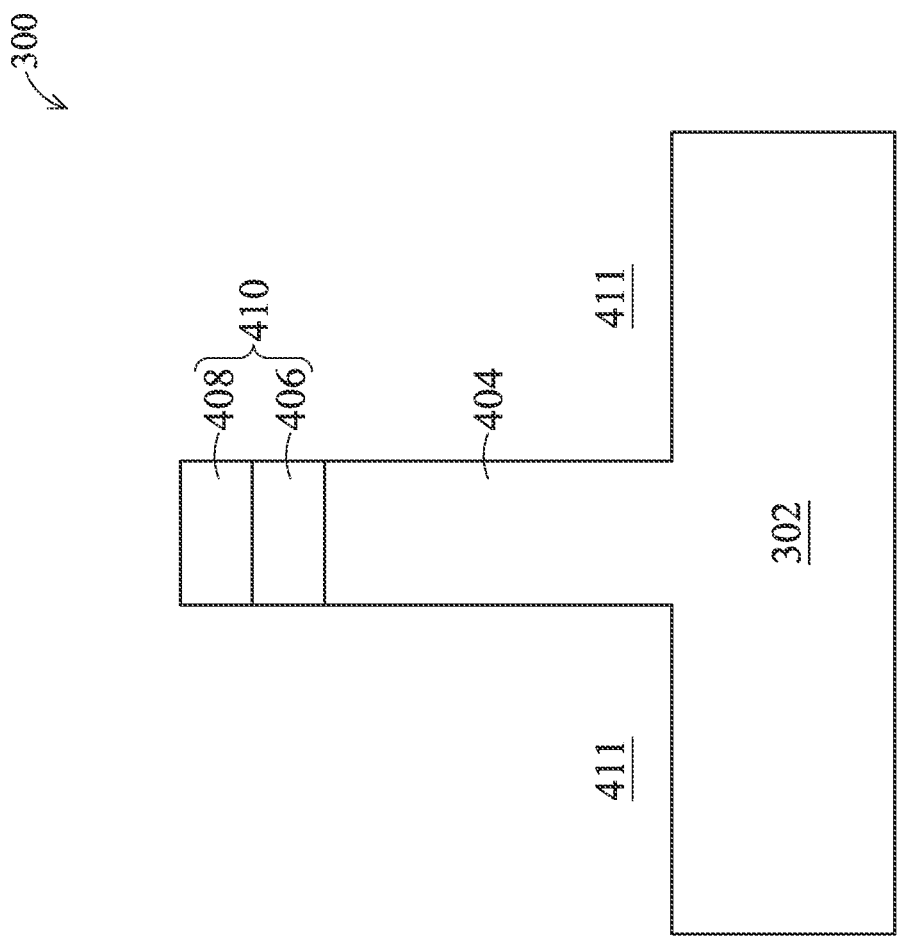

Corresponding to operation 204 of FIG. 2, FIG. 4 is a cross-sectional view of the FinFET device 300 including a (semiconductor) fin 404 at one of the various stages of fabrication. Although one fin is shown in the illustrated embodiment of FIG. 4 (and the following figures), it should be appreciated that the FinFET device 300 can include any number of fins while remaining within the scope of the present disclosure. In some embodiments, the fin 404 is formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining a fin 404 between adjacent trenches 411 as illustrated in FIG. 4. When multiple fins are formed, such a trench may be disposed between any adjacent ones of the fins. In some embodiments, the fin 404 is formed by etching trenches in the substrate 302 using, for example, reactive ion etch (RIE), neutral beam etch (NBE), the like, or combinations thereof. The etching may be anisotropic. In some embodiments, the trenches 411 may be strips (viewed from the top) parallel to each other, and closely spaced with respect to each other. In some embodiments, the trenches 411 may be continuous and surround the fin 404. The fin 404 may also be referred to as fins 404 hereinafter.

The fin 404 may be patterned by any suitable method. For example, the fin 404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Figure 5:
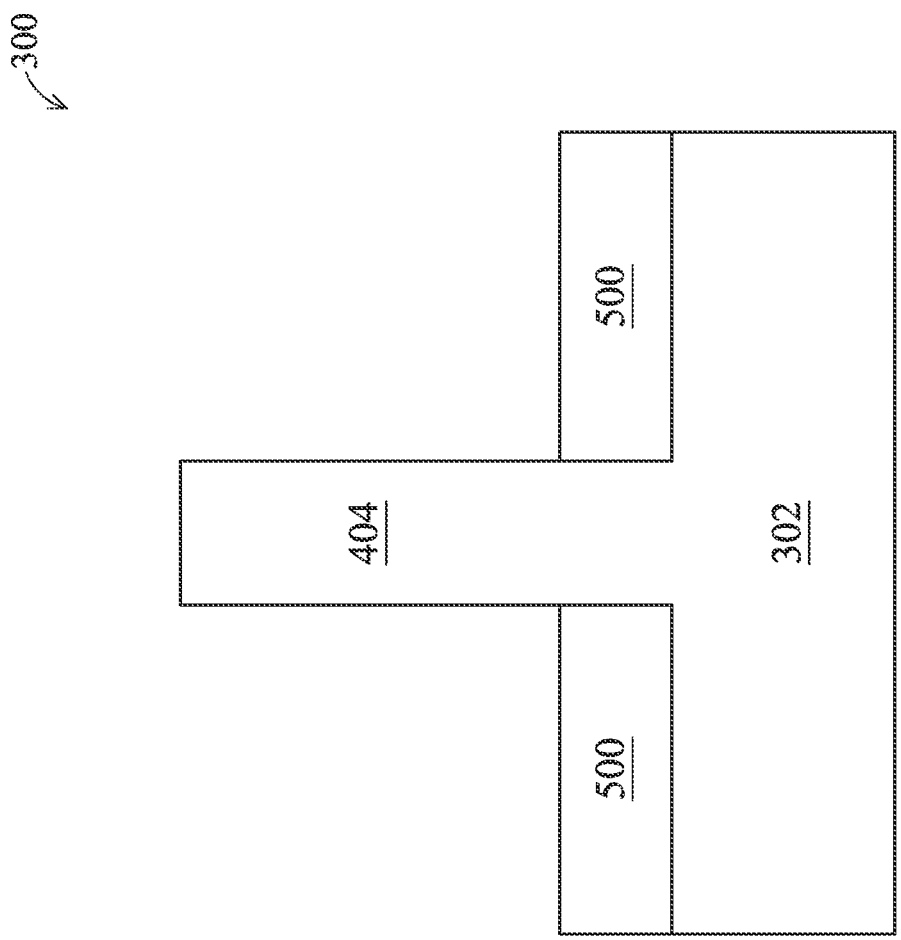

Corresponding to operation 206 of FIG. 2, FIG. 5 is a cross-sectional view of the FinFET device 300 including isolation regions 500 at one of the various stages of fabrication. The isolation regions 500, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and a top surface of the fin 404 that are coplanar (not shown, the isolation regions 500 will be recessed as shown in FIG. 5). The patterned mask 410 (FIG. 4) may also be removed by the planarization process.

In some embodiments, the isolation regions 500 include a liner, e.g., a liner oxide (not shown), at the interface between each of the isolation regions 500 and the substrate 302 (fin 404). In some embodiments, the liner oxide is formed to reduce crystalline defects at the interface between the substrate 302 and the isolation region 500. Similarly, the liner oxide may also be used to reduce crystalline defects at the interface between the fin 404 and the isolation region 500. The liner oxide (e.g., silicon oxide) may be a thermal oxide formed through a thermal oxidation of a surface layer of the substrate 302, although other suitable method may also be used to form the liner oxide.

Next, the isolation regions 500 are recessed to form shallow trench isolation (STI) regions 500, as shown in FIG. 5. The isolation regions 500 are recessed such that the upper portions of the fin 404 protrude from between neighboring STI regions 500. Respective top surfaces of the STI regions 500 may have a flat surface (as illustrated), a convex surface, a concave surface (such as dishing), or combinations thereof. The top surfaces of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

FIGS. 3 through 5 illustrate an embodiment of forming one or more fins (such as fin 404), but a fin may be formed in various different processes. For example, a top portion of the substrate 302 may be replaced by a suitable material, such as an epitaxial material suitable for an intended type (e.g., n-type or p-type) of semiconductor devices to be formed. Thereafter, the substrate 302, with epitaxial material on top, is patterned to form the fin 404 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fin 404 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
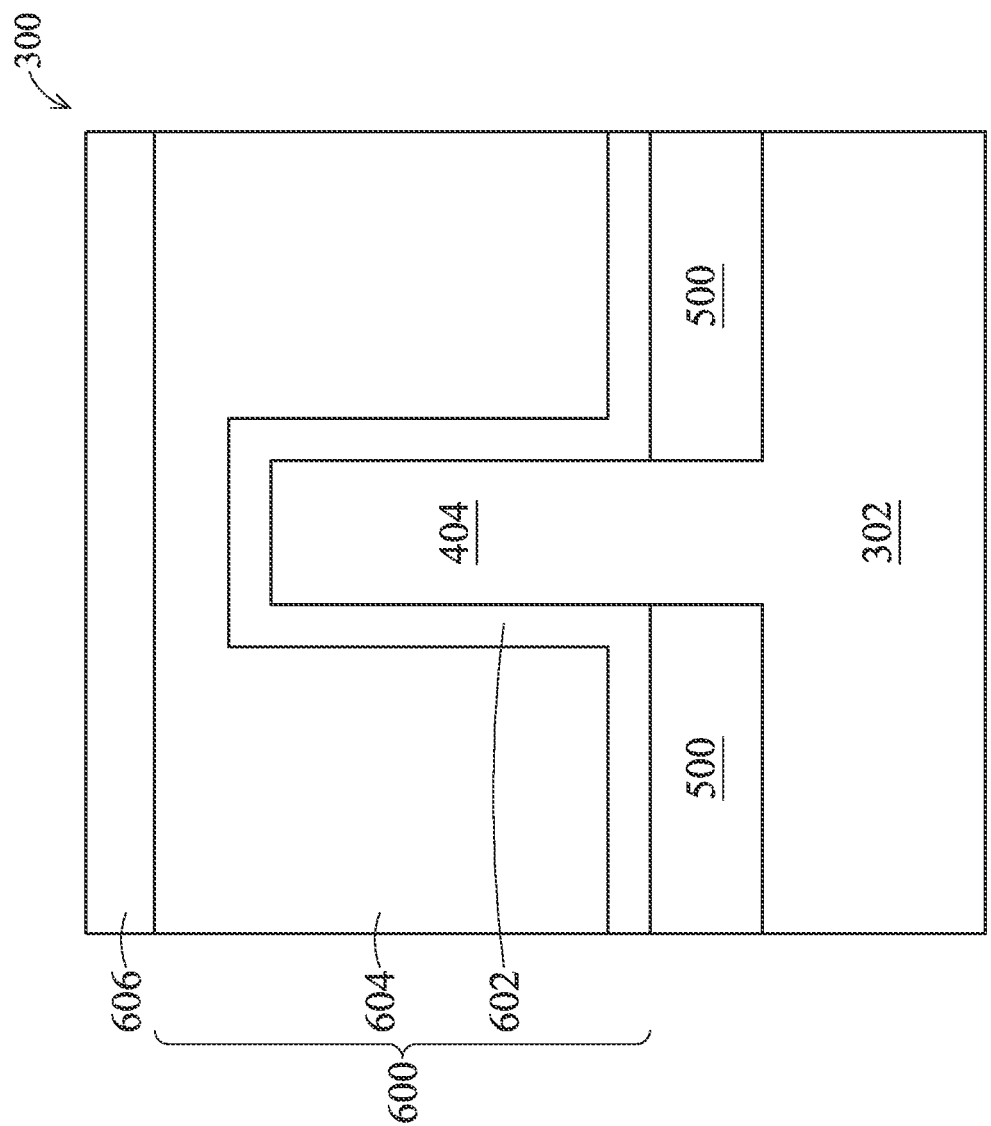

Corresponding to operation 208 of FIG. 2, FIG. 6 is a cross-sectional view of the FinFET device 300 including a dummy gate structure 600 at one of the various stages of fabrication. The dummy gate structure 600 includes a dummy gate dielectric 602 and a dummy gate 604, in some embodiments. A mask 606 may be formed over the dummy gate structure 600. To form the dummy gate structure 600, a dielectric layer is formed on the fin 404. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form the mask 606. The pattern of the mask 606 then may be transferred to the gate layer and the dielectric layer by an acceptable etching technique to form the dummy gate 604 and the underlying dummy gate dielectric 602, respectively. The dummy gate 604 and the dummy gate dielectric 602 cover a central portion (e.g., a channel region) of the fin 404. The dummy gate 604 may also have a lengthwise direction (e.g., direction B-B of FIG. 1) substantially perpendicular to the lengthwise direction (e.g., direction of A-A of FIG. 1) of the fin 404.

The dummy gate dielectric 602 is shown to be formed over the fin 404 (e.g., over top surfaces and sidewalls of the fin 404) and over the STI regions 500 in the example of FIG. 6. In other embodiments, the dummy gate dielectric 602 may be formed by, e.g., thermal oxidization of a material of the fin 404, and therefore, may be formed over the fin 404 but not over the STI regions 500. It should be appreciated that these and other variations are still included within the scope of the present disclosure.

FIGS. 7-19 illustrate the cross-sectional views of further processing (or making) of the FinFET device 300 along cross-section A-A (along a longitudinal axis of the fin 404), as shown in FIG. 1. In brief overview, three dummy gate structures 600A, 600B, and 600C are illustrated over the fin 404 in the examples of FIGS. 7-9, and three corresponding gate trenches 1000A, 1000B, and 1000C (formed by removing the dummy gate structures 600A-C) are illustrated in the example of FIG. 10. For simplicity, the dummy gate structures 600A to 600C may sometimes be collectively referred to as dummy gate structures 600. It should be appreciated that more or less than three dummy gate structures can be formed over the fin 404, while remaining within the scope of the present disclosure.

Figure 7:
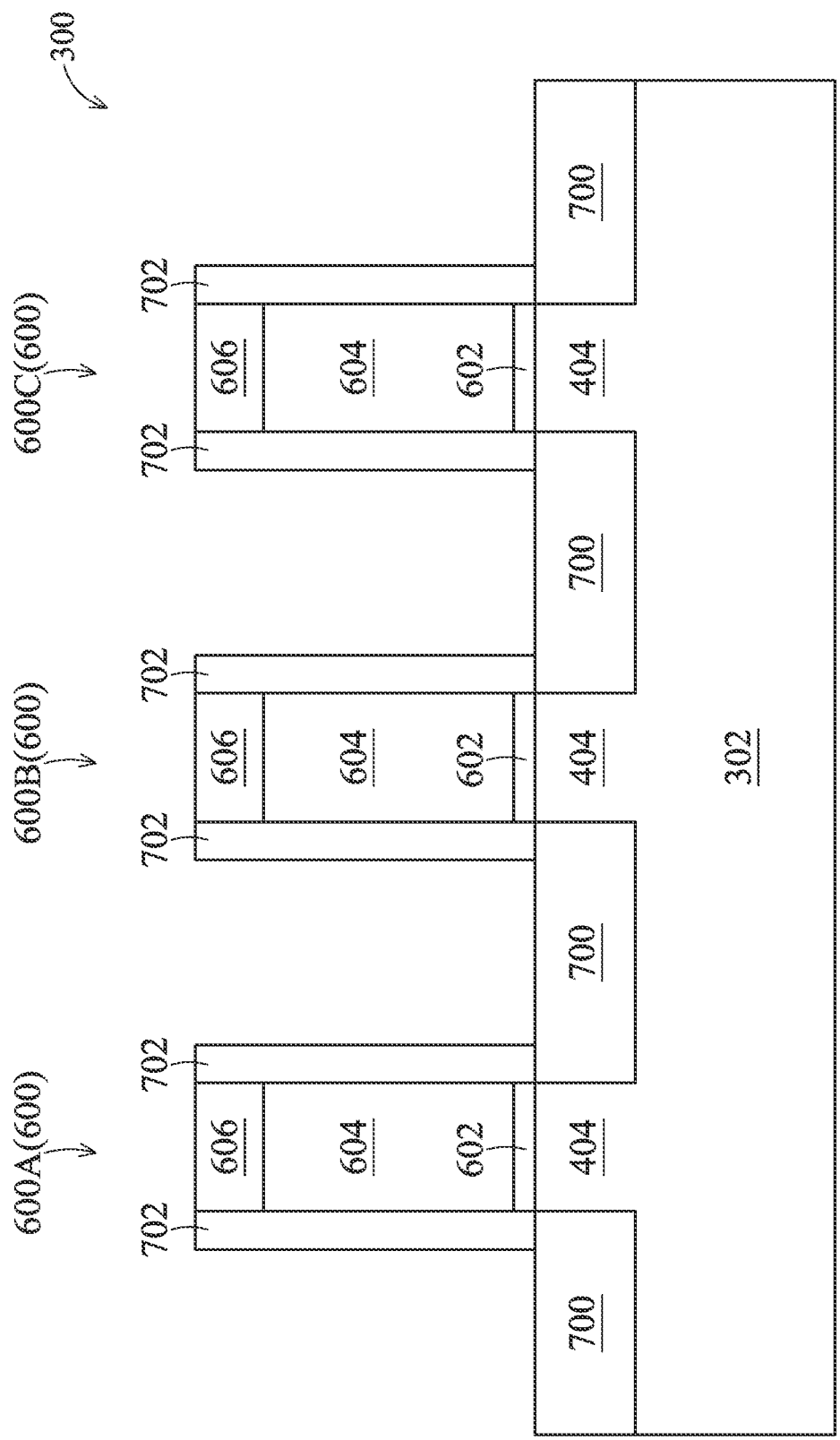

Corresponding to operation 210 of FIG. 2, FIG. 7 is a cross-sectional view of the FinFET device 300 including a number of lightly doped drain (LDD) regions 700 formed in the fin 404 at one of the various stages of fabrication. The LDD regions 700 may be formed by a plasma doping process. The plasma doping process may include forming and patterning masks such as a photoresist to cover the regions of the FinFET device 300 that are to be protected from the plasma doping process. The plasma doping process may implant n-type or p-type impurities in the fin 404 to form the LDD regions 700. For example, p-type impurities, such as boron, may be implanted in the fin 404 to form the LDD regions 700 for a p-type device. In another example, n-type impurities, such as phosphorus, may be implanted in the fin 404 to form the LDD regions 700 for an n-type device. In some embodiments, the LDD regions 700 abut one of the channel regions of the FinFET device 300 (e.g., the central portion of the fin 404 overlaid by one of the dummy gate structures 600). Portions of the LDD regions 700 may extend under the dummy gate structure 600 and into the channel region of the FinFET device 300. FIG. 7 illustrates a non-limiting example of the LDD regions 700. Other configurations, shapes, and formation methods of the LDD regions 700 are also possible and are fully intended to be included within the scope of the present disclosure. For example, the LDD regions 700 may be formed after gate spacers 702, which will be discussed below, are formed. In some embodiments, the LDD regions 700 are omitted.

Still referring to FIG. 7, after the LDD regions 700 are formed, in some embodiments, gate spacers 702 are formed around (e.g., along and contacting the sidewalls of) the dummy gate structures 600. For example, the gate spacers 702 may be formed on opposing sidewalls of the dummy gate structure 600. It should be understood that any number of gate spacers can be formed around the dummy gate structures 600 while remaining within the scope of the present disclosure.

The gate spacers 702 may be a low-k spacer and may be formed of a suitable dielectric material, such as silicon oxide, silicon oxycarbonitride, silicon nitride, silicon oxynitride, silicon carbonitride, the like, or combinations thereof. Any suitable deposition method, such as thermal oxidation, chemical vapor deposition (CVD), or the like, may be used to form the gate spacers 702. The shapes and formation methods of the gate spacers 702 as illustrated in FIG. 7 (and the following figures) are merely non-limiting examples, and other shapes and formation methods are possible. These and other variations are fully intended to be included within the scope of the present disclosure.

Figure 8:
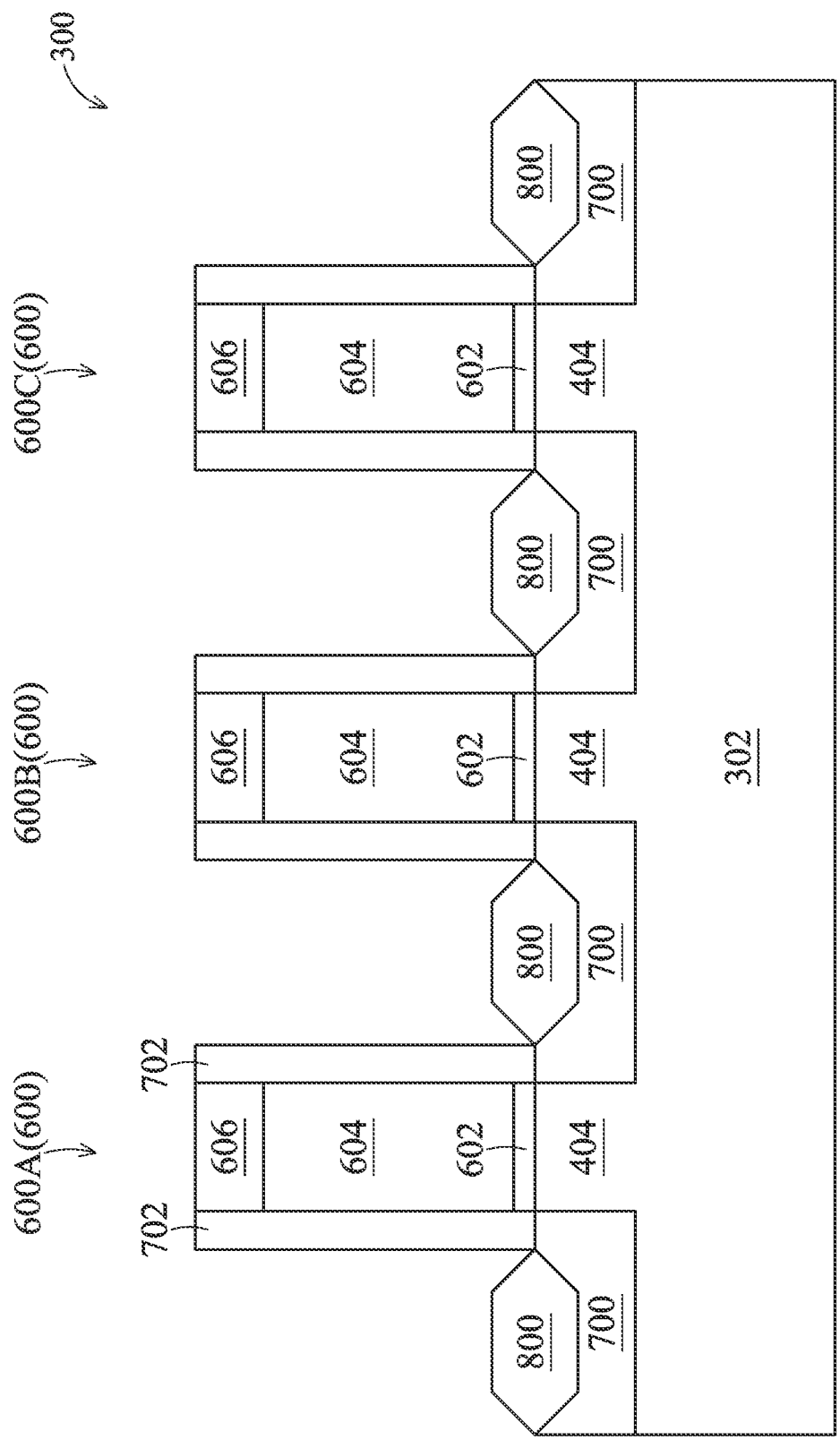

Corresponding to operation 212 of FIG. 2, FIG. 8 is a cross-sectional view of the FinFET device 300 including a number of source/drain regions 800 at one of the various stages of fabrication. The source/drain regions 800 are formed in recesses of the fin 404 adjacent to the dummy gate structures 600. For example, the source/drain regions 800 and the dummy gate structures 600 are alternately arranged. In other words, one source/drain region 800 is sandwiched between adjacent dummy gate structures 600 and/or merely one side of the source/drain region 800 is disposed next to a dummy gate structure 600. The recesses are formed by, e.g., an anisotropic etching process using the dummy gate structures 600 as an etching mask, in some embodiments, although any other suitable etching process may also be used.

The source/drain regions 800 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8, the epitaxial source/drain regions 800 may have surfaces raised from respective surfaces of the fin 404 (e.g. raised above the non-recessed portions of the fin 404) and may have facets. In some embodiments, the source/drain regions 800 of the adjacent fins may merge to form a continuous epitaxial source/drain region (not shown). In some embodiments, the source/drain regions 800 of the adjacent fins may not merge together and remain separate source/drain regions 800 (not shown). In some embodiments, when the resulting FinFET device is an n-type FinFET, the source/drain regions 800 can include silicon carbide (SiC), silicon phosphorous (SiP), phosphorous-doped silicon carbon (SiCP), or the like. In some embodiments, when the resulting FinFET device is a p-type FinFET, the source/drain regions 800 comprise SiGe, and a p-type impurity such as boron or indium.

The epitaxial source/drain regions 800 may be implanted with dopants to form source/drain regions 800 followed by an annealing process. The implanting process may include forming and patterning masks such as a photoresist to cover the regions of the FinFET device 300 that are to be protected from the implanting process. The source/drain regions 800 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain region 800 of a p-type transistor. N-type impurities, such as phosphorous or arsenide, may be implanted in the source/drain regions 800 of an n-type transistor. In some embodiments, the epitaxial source/drain regions 800 may be in situ doped during their growth.

Figure 9:
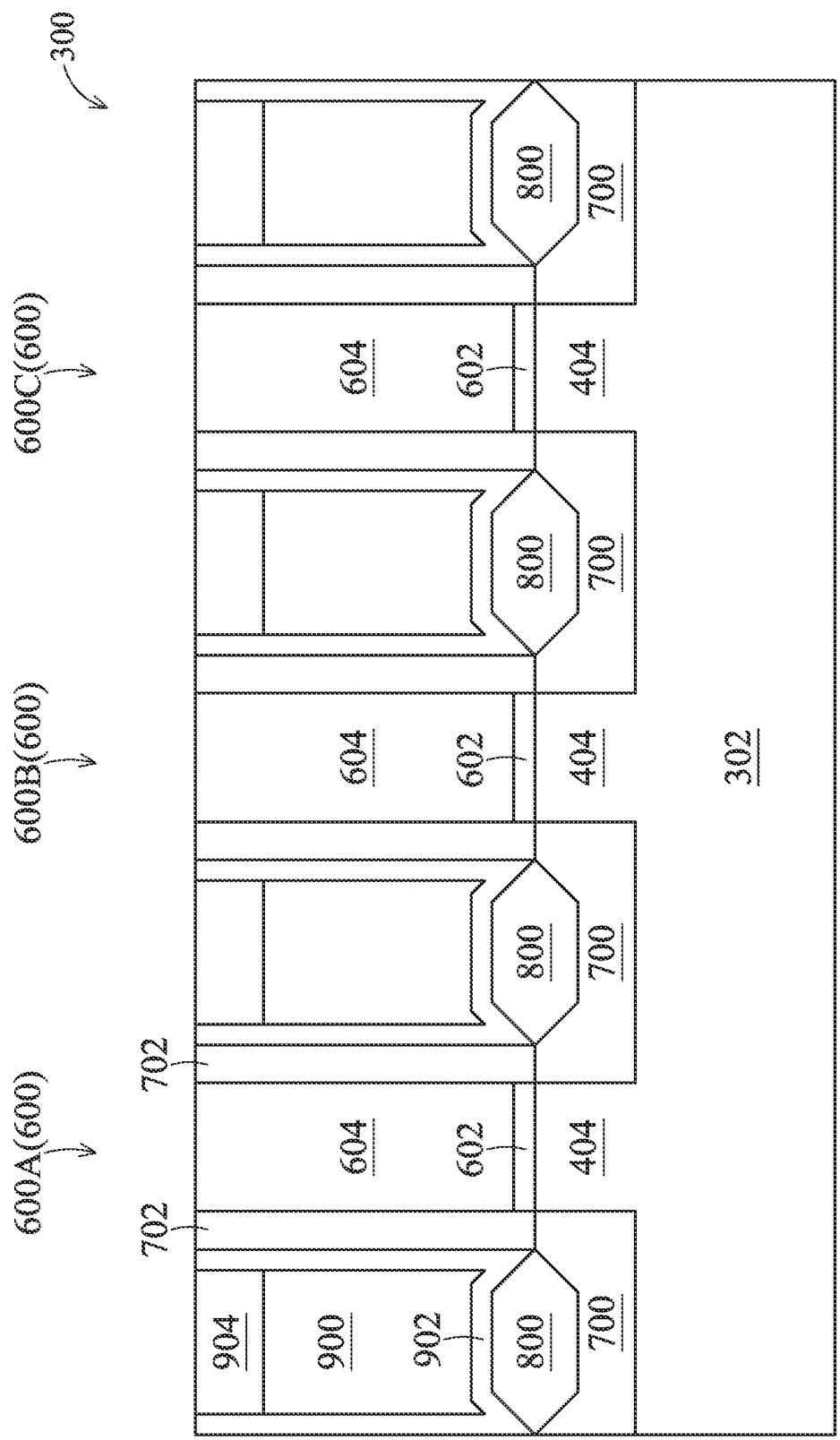
Figure 10:
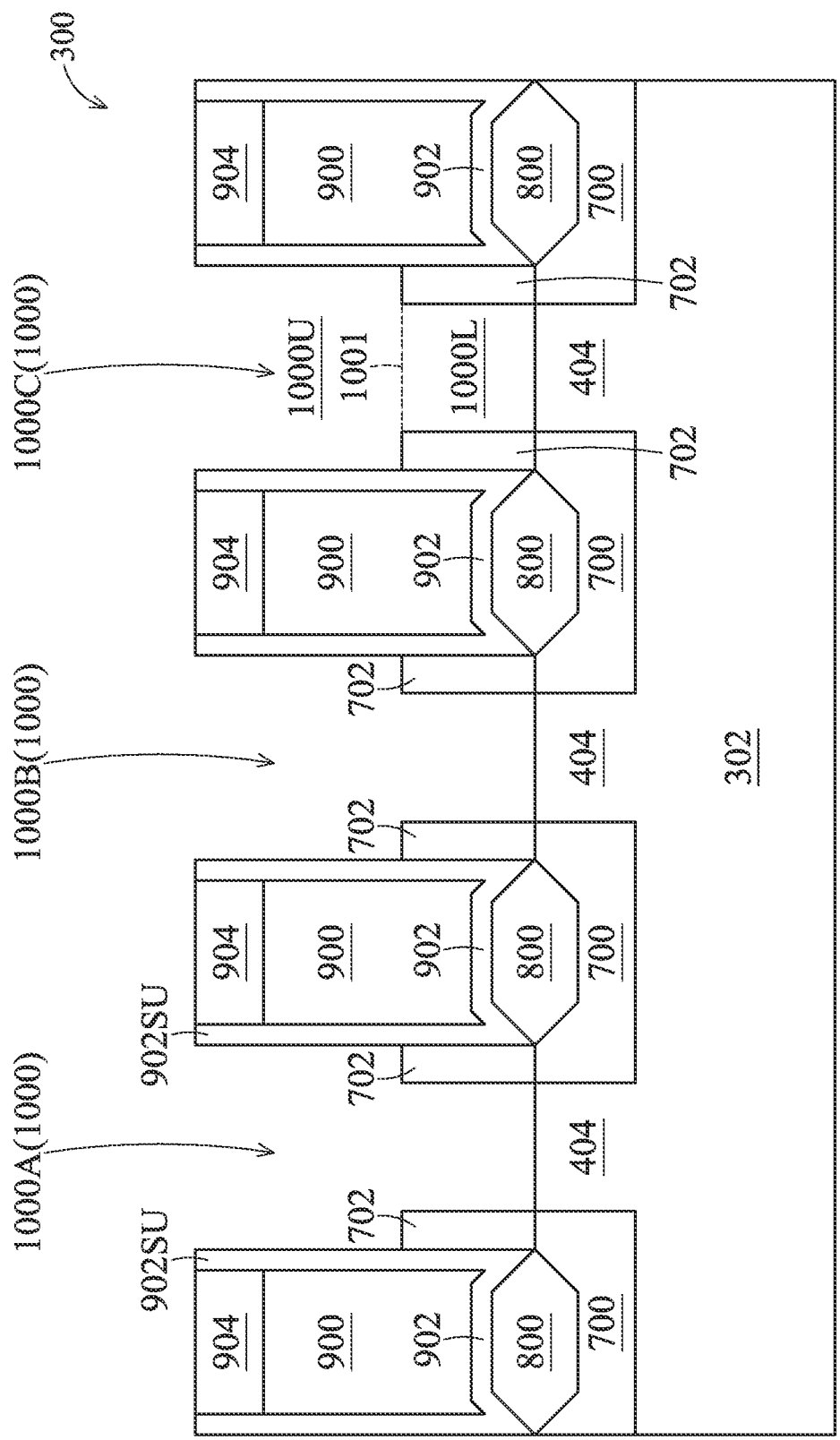

Corresponding to operation 214 of FIG. 2, FIG. 9 is a cross-sectional view of the FinFET device 300 including an interlayer dielectric (ILD) 900 at one of the various stages of fabrication. In some embodiments, prior to forming the ILD 900, a contact etch stop layer (CESL) 902 is formed over the structure illustrated in FIG. 9. The CESL 902 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 900 is formed over the CESL 902 and over the dummy gate structures 600 (e.g., 600A, 600B, and 600C). In some embodiments, the ILD 900 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 900 is formed, a dielectric layer 904 is formed over the ILD 900. The dielectric layer 904 can function as a protection layer to prevent or reduces the loss of the ILD 900 in subsequent etching processes. The dielectric layer 904 may be formed of a suitable material, such as silicon nitride, silicon carbonitride, or the like, using a suitable method such as CVD, PECVD, or FCVD. After the dielectric layer 904 is formed, a planarization process, such as a CMP process, may be performed to achieve a level upper surface for the dielectric layer 904. The CMP may also remove the mask 606 and portions of the CESL 902 disposed over the dummy gate 604. After the planarization process, the upper surface of the dielectric layer 904 is level with the upper surface of the dummy gate 604, in some embodiments.

An example gate-last process (sometimes referred to as replacement gate process) is performed subsequently to replace the dummy gate 604 and the dummy gate dielectric 602 of each of the dummy gate structures 600 with an active gate structure (which may also be referred to as a replacement gate structure or a metal gate structure).

Corresponding to operation 216 of FIG. 2, FIG. 10 is a cross-sectional view of the FinFET device 300 in which the dummy gate structures 600A, 600B, and 600C (FIG. 9) are removed to form gate trenches 1000A, 1000B, and 1000C, respectively, at one of the various stages of fabrication. Next, upper portions of the gate trenches 1000A, 1000B, and 1000C are horizontally expanded by removing relative upper portions of the gate spacers 702, such that each of the gate trenches 1000A, 1000B, and 1000C has an upper trench 1000U and a lower trench 1000L, where the upper trench 1000U is wider than the lower trench 1000L horizontally. Details of forming the gate trenches 1000A-C will be discussed below. For simplicity, the gate trenches 1000A-C may sometimes be collectively referred to as gate trenches 1000.

In some embodiments, to remove the dummy gate structures 600, one or more etching steps are performed to remove the dummy gate 604 and the dummy gate dielectric 602 directly under the dummy gate 604, so that the gate trenches 1000 (which may also be referred to as recesses) are formed between respective gate spacers 702. Each gate trench 1000 exposes the channel region of the fin 404. During the dummy gate removal, the dummy gate dielectric 602 may be used as an etch stop layer when the dummy gate 604 is etched. The dummy gate dielectric 602 may then be removed after the removal of the dummy gate 604.

Next, an anisotropic etching process, such as a dry etch process, is performed to remove upper portions of the gate spacers 702. In some embodiments, the anisotropic etching process is performed using an etchant that is selective to (e.g., having a higher etching rate for) the material of the gate spacers 702, such that the gate spacers 702 are recessed (e.g., upper portions removed) without substantially attacking the dielectric layer 904 or the CESL 902. After the upper portions of the gate spacers 702 are removed, upper sidewalls 902SU of the CESL 902 are exposed.

As illustrated in FIG. 10, after the upper portions of the gate spacers 702 are removed, each of the gate trenches 1000 has an upper trench 1000U and a lower trench 1000L. The lower trench 1000L is between the remaining lower portions of the gate spacers 702. The upper trench 1000U is over the lower trench, and is defined (e.g., bordered) by the upper sidewalls 904SU of the CESL 902. FIG. 10 illustrates a symbolic interface 1001 between the upper trench 1000U and the lower trench 1000L. The interface 1001 is level with an upper surface 1000U of the remaining lower portions of the gate spacers 702. Each of the gate trenches 1000 has a wider upper trench 1000U and a narrow lower trench 1000L.

Figure 11:
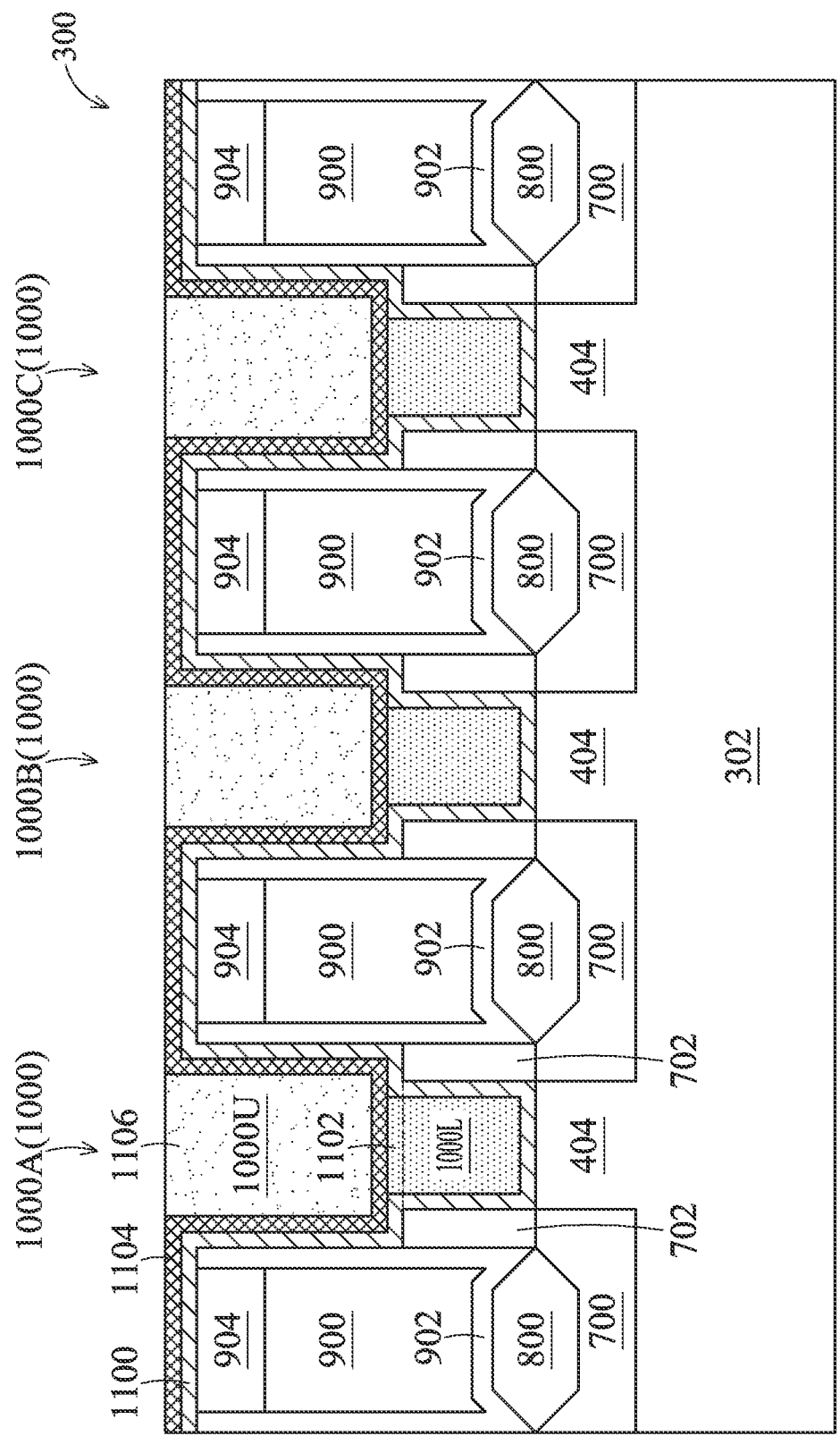
Figure 12:
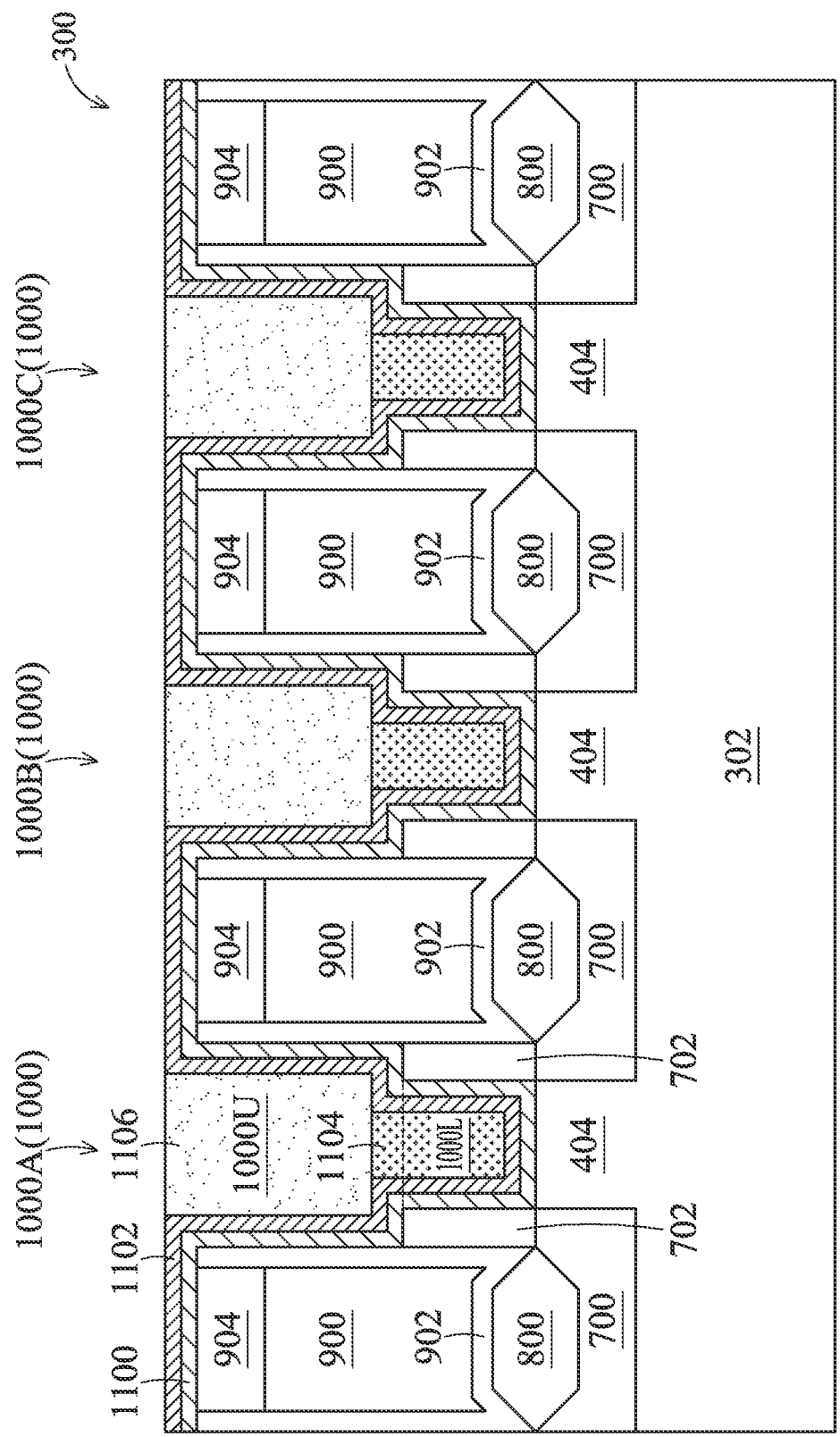

Corresponding to operation 218 of FIG. 2, FIG. 11 is a cross-sectional view of the FinFET device 300 including a gate dielectric (layer) 1100, a work function metal (layer) 1102, a glue metal (layer) 1104, and an electrode metal (layer) 1106 at one of the various stages of fabrication, in one of various embodiments. Also corresponding to operation 218, FIG. 12 is a cross-sectional view of the FinFET device 300 including the gate dielectric (layer) 1100, the work function metal (layer) 1102, the glue metal (layer) 1104, and the electrode metal (layer) 1106 at one of the various stages of fabrication, in another of various embodiments.

The gate dielectric 1100, the work function metal 1102, the glue metal 1104, and the electrode metal (layer) 1106 are formed successively in the gate trenches 1000. In the illustrated example of FIG. 11, the gate dielectric 1100 is formed to line the gate trench 1000, with the work function metal 1102 filling the lower trench 1000L and the glue metal 1104 lining the upper trench 1000U. In the illustrated example of FIG. 12, the gate dielectric 1100 and work function metal 1102 are formed to respectively line the gate trench 1100, with the glue metal 1104 filling the lower trench 1000L. In either of the examples, the electrode metal 1106 can fill the upper trench 1000U.

For example, the gate dielectric 1100 is deposited conformally in the gate trenches 1000, such as on the top surfaces and the sidewalls of the fin 404, on the top surfaces and the sidewalls of the gate spacers 702, and on the top surface of the dielectric layer 904. In accordance with some embodiments, the gate dielectric 1100 includes silicon oxide, silicon nitride, or multilayers thereof. In example embodiments, the gate dielectric 1100 includes a high-k dielectric material, and in these embodiments, the gate dielectric 1100 may have a k value (dielectric constant) greater than about 7.0, and may include a metal oxide or a silicate of Hf, Al, Zr, La, Mg, Ba, Ti, Pb, and combinations thereof. The formation methods of gate dielectric 1100 may include molecular beam deposition (MBD), atomic layer deposition (ALD), PECVD, and the like. A thickness of the gate dielectric 1100 may be between about 8 angstroms (Å) and about 20 angstroms, as an example. A thickness of the gate dielectric 1100 may be between about 5 nanometer (nm) and about 25 nm, as another example.

Next, the work function metal 1102 is formed over the gate dielectric 1100. The work function metal 1102 may be a p-type work function layer, an n-type work function layer, multi-layers thereof, or combinations thereof, in some embodiments. In the illustrated example of FIG. 11, the work function metal 1102 is an n-type work function layer. In the discussion herein, a work function layer may also be referred to as a work function metal.

Example p-type work function metals that may be included in the gate structures for p-type devices include TiN, TaN, Ru, Mo, Al, WN, $ZrSi_2$, $MoSi_2$, $TaSi_2$, $NiSi_2$, other suitable p-type work function materials, or combinations thereof. Example n-type work function metals that may be included in the gate structures for n-type devices include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function metal may be deposited by CVD, physical vapor deposition (PVD), ALD, and/or other suitable process. A thickness of a p-type work function layer may be between about 8 Å and about 15 Å, and a thickness of an n-type work function layer may be between about 15 Å and about 30 Å, as an example. A thickness of a p-type work function layer may be between about 5 nanometer (nm) and about 25 nm, and a thickness of an n-type work function layer may be between about 5 nm and about 25 nm, as another example.

Next, the glue metal 1104 is formed over the work function metal 1102. The glue metal 1104 functions as an adhesion layer between the underlying layer (e.g., 1102) and a subsequently formed gate electrode material over the glue metal 1104. The glue metal 1104 may be formed of a suitable material, such as titanium nitride, using a suitable deposition method such as CVD, PVD, ALD, or the like. A thickness of the glue metal 1104 may be between about 5 nanometer (nm) and about 25 nm, as an example.

Next, the electrode metal 1106 is formed over the glue meal 1104. In various embodiments, at the current fabrication stage, the electrode metal 1106 can fill up the remaining portion of the gate trench 1000, e.g., the upper trench 100U. The electrode metal 1106 may be formed of a suitable material, such as tungsten (W), using a suitable deposition method such as CVD, PVD, ALD, or the like. In various embodiments, the formations of the gate dielectric 1100, work function metal 1102, glue metal 1104, and electrode metal 1106 may be sequentially performed, e.g., without other etching process inserted therebetween.

Depending on a width of the lower trench 1000L and/or a thicknesses of the work function metal 1102, the work function metal 1102 (together with a portion of the gate dielectric 1100) can fill the lower trench 1000L, as illustrated in the example of FIG. 11, or the work function metal 1102 and glue metal 1104 (together with a portion of the gate dielectric 1100) can collectively fill the lower trench 1000L, as illustrated in the example of FIG. 12. Specifically in FIG. 11, a top surface of the work function metal 1102 is in direct contact with the glue metal 1104, with a bottom surface and sidewalls of the work function metal 1102 enclosed by (in contact with) the gate dielectric 1100. Specifically in FIG. 12, a top surface of the glue metal 1104 is in direct contact with a bottom surface of the electrode metal 1106, with a bottom surface and sidewalls of the glue metal 1104 enclosed by (in contact with) the work function meal 1102.

Figure 13:
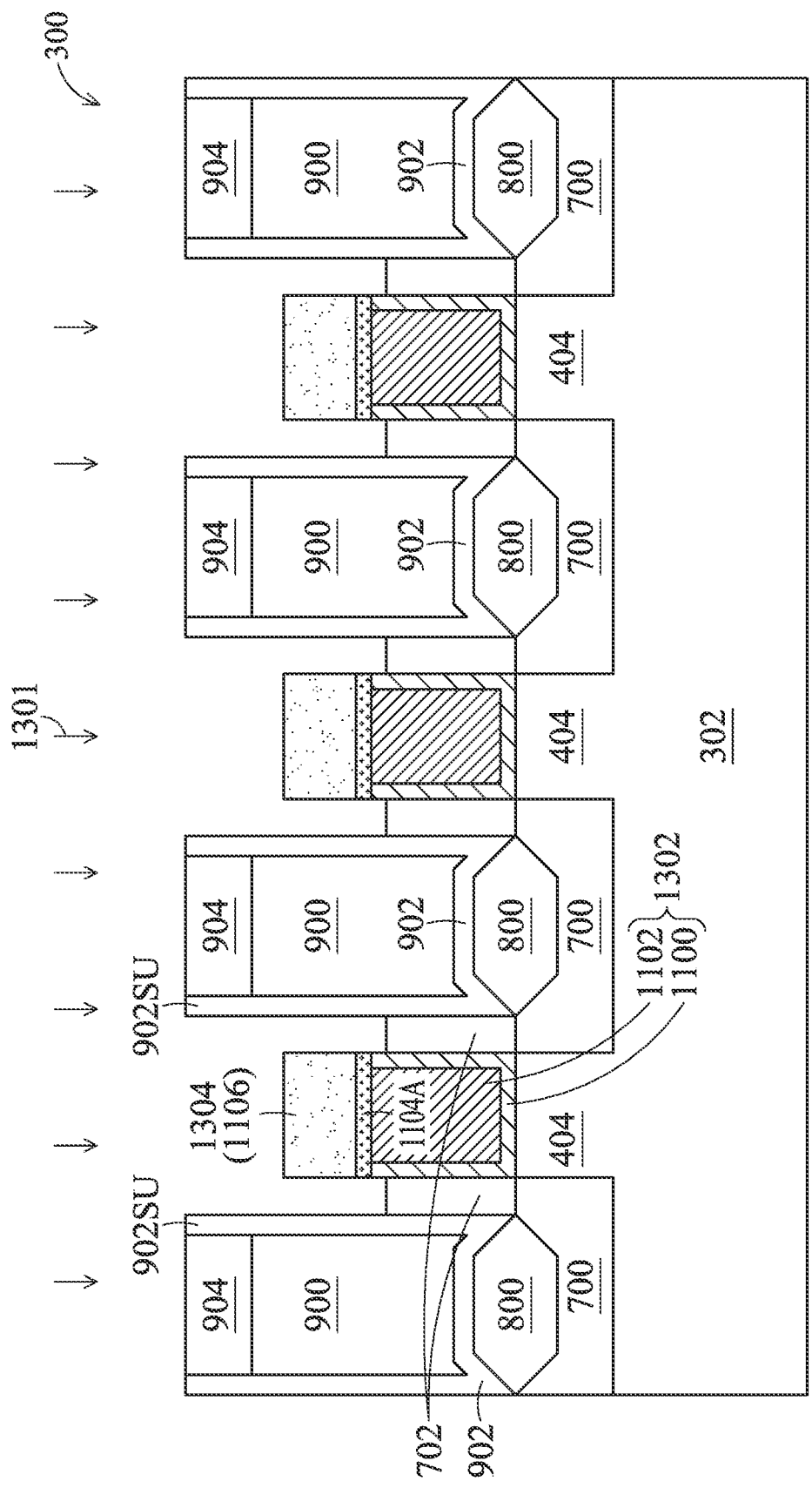
Figure 14:
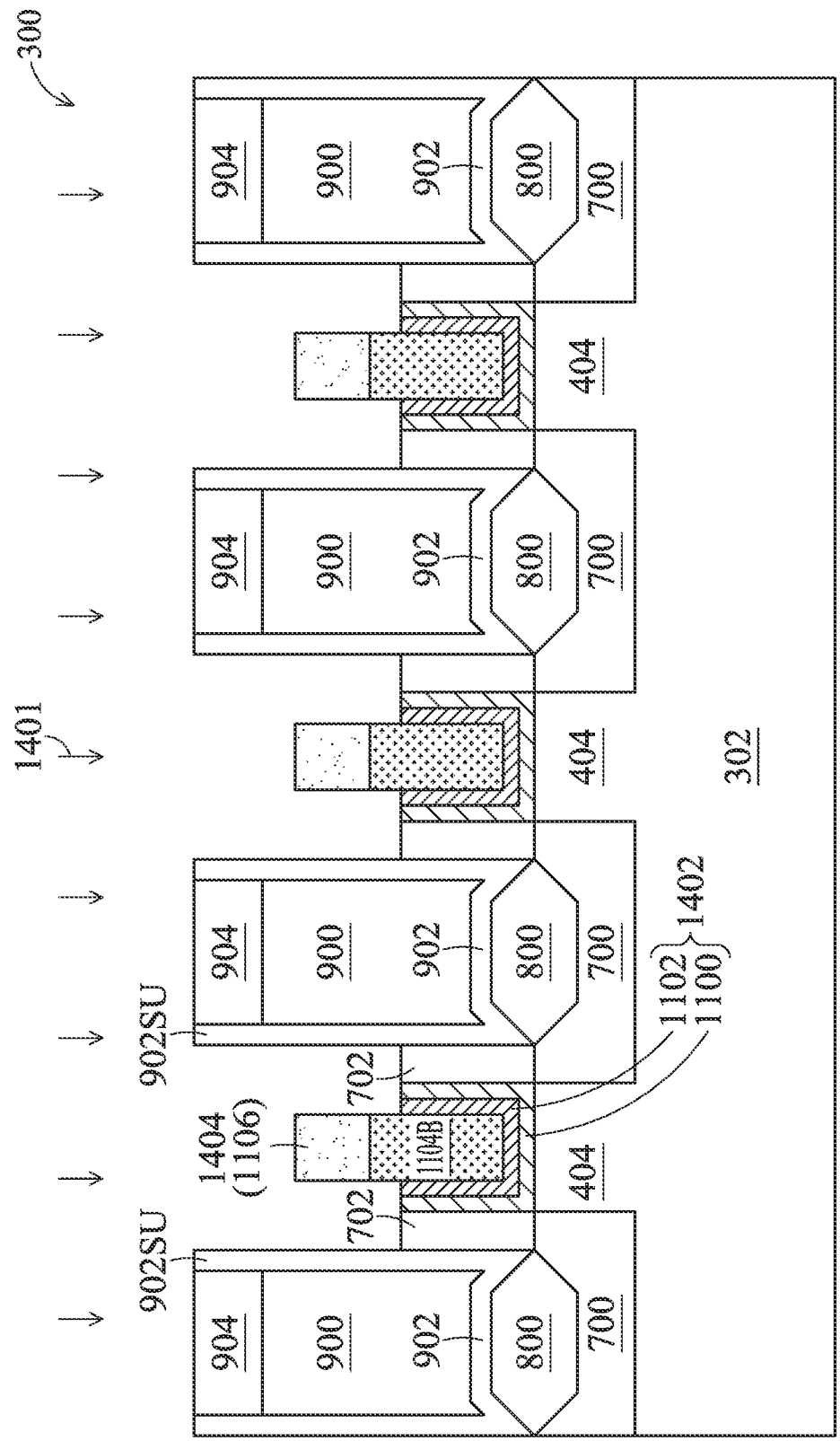

Corresponding to operation 220 of FIG. 2, FIGS. 13 and 14 are cross-sectional views of the FinFET device 300 in which the gate dielectric 1100, work function metal 1102, glue metal 1104, and electrode metal 1106 are patterned at one of the various stages of fabrication. Specifically, FIG. 13 shows the FinFET device 300 following the example of FIG. 11, and FIG. 14 shows the FinFET device 300 following the example of FIG. 12.

Referring first to FIG. 13, at least one etching process 1301 may be performed to remove respective portions of the gate dielectric 1100, work function metal 1102, glue metal 1104, and electrode metal 1106. For example, the portions of the gate dielectric 1100 disposed above the gate spacers 702 and extending along the upper sidewalls 902SU, and the portions of glue metal 1104 disposed above the gate spacers 702 and extending along the upper sidewalls 902SU can be removed by the etching process 1301. Further, the electrode metal 1106 can also be shaped by the etching process 1301.

As a result, a metal gate structure 1302 and a gate electrode 1304 can be formed by the remaining portions of the gate dielectric 1100 and work function metal 1102 and the remaining portion of the electrode metal 1106, respectively. The gate electrode 1304 can thus protrude away from the metal gate structure 1302 and/or the gate spacers 702. As shown, the gate electrode 1304 has its top surface and sidewalls totally above the top surface of the gate spacers 702 and the top surface of the metal gate structure 1302. Specifically, a remaining portion of the glue metal 1104 (hereinafter "patterned glue metal 1104A") is vertically disposed between a bottom surface of the gate electrode 1304 and a top surface of the metal gate structure 1302. The patterned glue metal 1104A may be formed as a thin layer extending along the bottom surface of the gate electrode 1304. Further, the patterned glue metal 1104A and the gate electrode 1304 can have their respective sidewalls aligned with each other. Stated another way, the sidewalls of the patterned glue metal 1104A are spaced from each other with a first distance and the sidewalls of the gate electrode 1304 are spaced from each other with a second distance, wherein the second distance is substantially similar to the first distance. Still further, the respective sidewalls of the patterned glue metal 1104A and the gate electrode 1304 are further aligned with inner sidewalls of the gate spacers 702. Still further, the patterned glue metal 1104A can have its bottom surface positioned above the top surface of the gate spacers 702, with a distance that is approximately the thickness of the gate dielectric 1100.

Referring first to FIG. 14, at least one etching process 1401 may be performed to remove respective portions of the gate dielectric 1100, work function metal 1102, glue metal 1104, and electrode metal 1106. For example, the portions of the gate dielectric 1100 disposed above the gate spacers 702 and extending along the upper sidewalls 902SU, and the portions of work function metal 1102 disposed above the gate spacers 702 and extending along the upper sidewalls 902SU can be removed by the etching process 1401. Further, the electrode metal 1106 can also be shaped by the etching process 1401.

As a result, a metal gate structure 1402 and a gate electrode 1404 can be formed by the remaining portions of the gate dielectric 1100 and work function metal 1102 and the remaining portion of the electrode metal 1106, respectively. The gate electrode 1404 can thus protrude away from the metal gate structure 1402 and/or the gate spacers 702. As shown, the gate electrode 1404 has its top surface and sidewalls totally above the top surface of the gate spacers 702 and the top surface of the gate structure 1402. Specifically, a remaining portion of the glue metal 1104 (hereinafter "patterned glue metal 1104B"), formed below the gate electrode 1404, may have its sidewalls and bottom surface kept enclosed by the metal gate structure 1402. The patterned glue metal 1104B may be formed as a fin extending along a bottom surface of the gate electrode 1404. Further, sidewalls of the patterned glue metal 1104B and sidewalls of the gate electrode 1404 may be aligned with each other. Stated another way, the sidewalls of the patterned glue metal 1104B are spaced from each other with a first distance and the sidewalls of the gate electrode 1404 are spaced from each other with a second distance, wherein the second distance is substantially similar to the first distance. Still further, a top surface of the patterned glue metal 1104B is positioned above the top surface of the metal gate structure 1402, which is approximately aligned with the top surface of the gate spacers 702, with a distance that is approximately a combination of the thickness of gate dielectric 1100 and the thickness of work function meal 1102.

In various embodiments, each of the etching processes 1301 and 1401 may be a dry etching process. For example, the etching process 1301/1401 can include a plasma etching process, which can have a certain amount of anisotropic characteristic. In such a plasma etching process (including radical plasma etching, remote plasma etching, and other suitable plasma etching processes), etchant gas sources such as chlorine ($Cl_2$), hydrogen bromide (HBr), carbon tetrafluoride ($CF_4$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, the gas sources and/or the passivation gases can be diluted with gases such as argon (Ar), helium (He), neon (Ne), and other suitable dilutive gases and combinations thereof to form the gate electrode 1304/1404, as described above.

As a non-limiting example, a source power of about 350 watts to about 1200 watts, a bias power of about 0 watts to about 300 watts, a pressure of about 1 millitorr to about 10 torr, and an etchant gas flow of about 0 standard cubic centimeters per minute to 300 standard cubic centimeters per minute (SCCM) may be used in the etching process 1301/1401. For instance, at least one of the following flow rates may be used: silicon tetrachloride in the flow rate from about 0 SCCM to about 50 SCCM, nitrogen trifluoride in the flow rate from about 0 SCCM to about 20 SCCM, hydrogen bromide in the flow rate from about 0 SCCM to about 100 SCCM, sulfur hexafluoride in the flow rate from about 0 SCCM to about 10 SCCM, or methane in the flow rate from about 0 SCCM to about 15 SCCM. However, it is noted that source powers, bias powers, pressures, and flow rates outside of these ranges are also contemplated.

Figure 15:
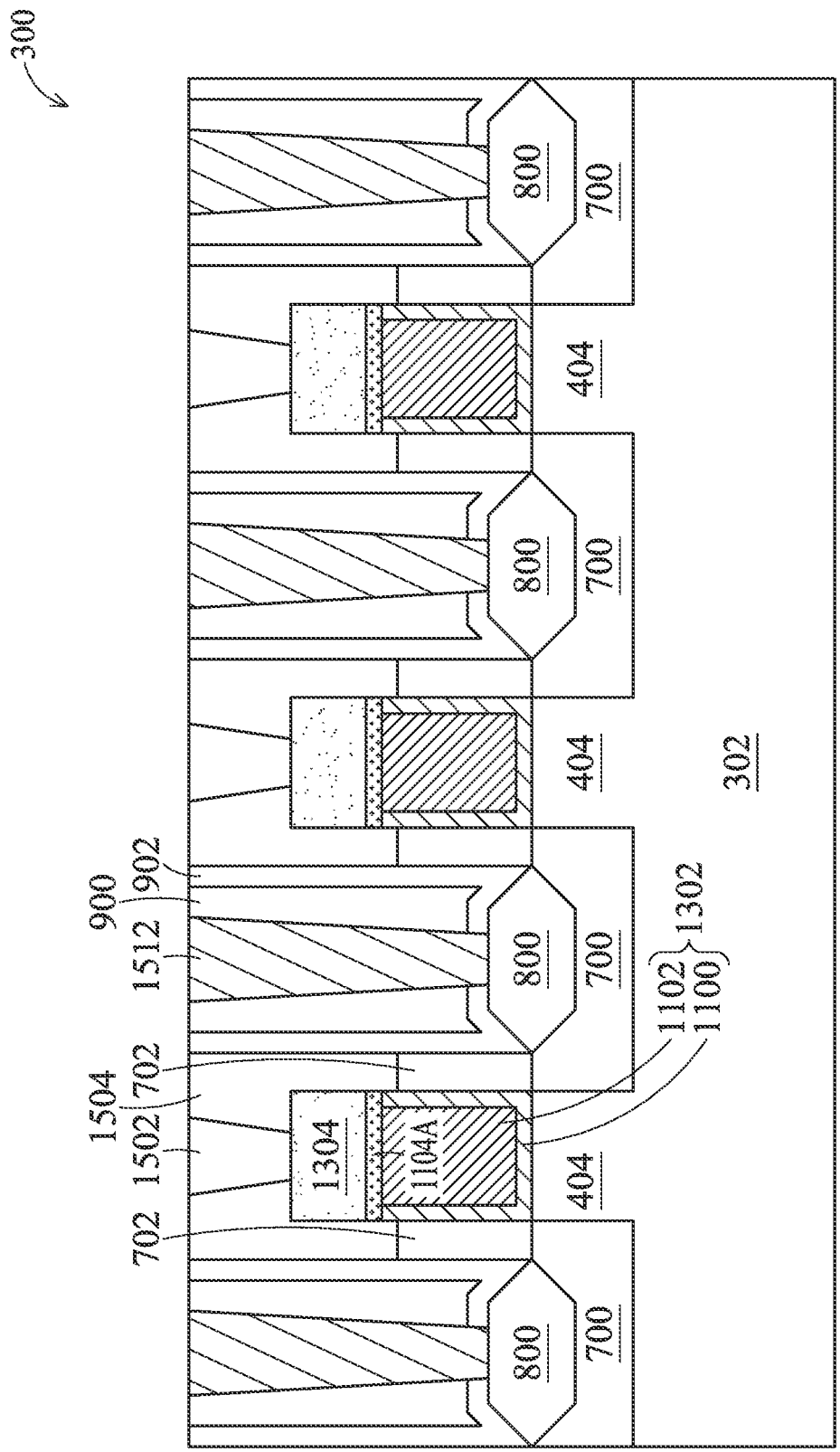
Figure 16:
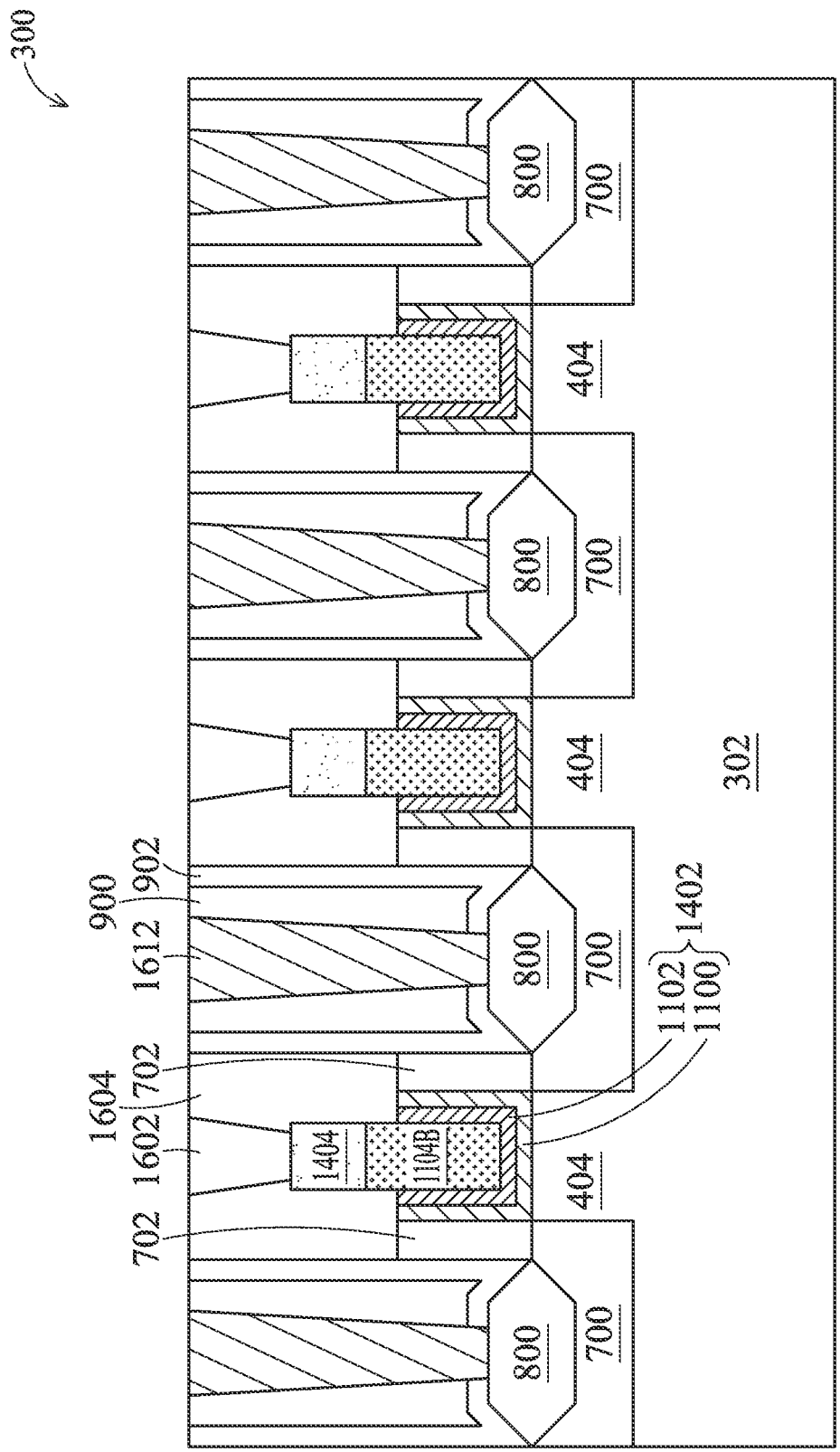

Corresponding to operation 222 of FIG. 2, FIGS. 15 and 16 are cross-sectional views of the FinFET device 300 in which one or more gate contacts 1502 and 1602 and one or more source/drain contacts 1512 and 1612 are formed at one of the various stages of fabrication. Specifically, FIG. 15 shows the FinFET device 300 following the example of FIG. 13, and FIG. 16 shows the FinFET device 300 following the example of FIG. 14.

In FIG. 15, the gate contact 1502 is formed in (e.g., to extend through) a dielectric material 1504 to electrically couple to the gate electrode 1304, and the source/drain contact 1512 is formed in (e.g., to extend through) the ILD 900 and CESL 902 to electrically couple to the source/drain region 800. Similarly, in FIG. 16, the gate contact 1602 is formed in (e.g., to extend through) a dielectric material 1604 to electrically couple to the gate electrode 1404, and the source/drain contact 1612 is formed in (e.g., to extend through) the ILD 900 and CESL 902 to electrically couple to the source/drain region 800. In some embodiments, the gate contact 1502/1602 may be formed subsequently to the formation of the source/drain contact 1512/1612. For example, the dielectric material 1504/1604 is first deposited in the remaining portion of the gate trench 1000, followed by the formation of the source/drain contacts. The dielectric material 1504/1604 (e.g., silicon oxide, silicon nitride, a low-k dielectric material, or the like) is formed in the gate trench 1000, using a suitable formation method such as PVD, CVD, or the like. Upon the source/drain contacts being formed, a contact opening is then formed in the dielectric material to expose the corresponding gate electrode 1304/1404, using, e.g., photolithography and etching. Once the contact opening is formed, a barrier layer, a seed layer, and a fill metal can be formed successively in the contact opening to form the corresponding gate contact 1502/1602.

Since the gate electrode 1304/1404 is being formed in a crown shape, as herein disclosed, the gate contact 1502/1602 can be formed with a relatively narrow width and can still land on a corresponding gate electrode. As such, a lateral spacing between the gate contact and source/drain contact can be effectively increased. Advantageously, the risk of having the source/drain contact and the gate contact short together can be significantly reduced.

The barrier layer includes an electrically conductive material such as titanium nitride, although other materials, such as tantalum nitride, titanium, tantalum, or the like, may alternatively be utilized. The barrier layer may be formed using a CVD process, such as PECVD. However, other alternative processes, such as sputtering, metal organic chemical vapor deposition (MOCVD), or ALD, may alternatively be used.

The seed layer is formed over the barrier layer. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer may include a titanium layer and a copper layer over the titanium layer.

The fill metal is deposited over the seed layer, and fills the remaining portion of the contact opening. The fill metal may be a metal-containing material such as copper (Cu), aluminum (Al), tungsten (W), the like, combinations thereof, or multi-layers thereof, and may be formed by, e.g., electroplating, electroless plating, or other suitable method. After the formation of the fill metal, a planarization process, such as a CMP, may be performed to remove the excess portions of the barrier layer, the seed layer, and the fill metal, which excess portions are over the upper surface of the dielectric layer 904 (referring again to FIG. 11). The resulting remaining portions of the barrier layer, the seed layer, and the fill metal thus form the gate contact 1502/1602.

In one aspect of the present disclosure, a semiconductor device is disclosed. The semiconductor device includes a semiconductor fin; gate spacers over the semiconductor fin; a metal gate structure, over the semiconductor fin, that is sandwiched by the gate spacers; and a gate electrode disposed above and in electrical contact with the metal gate structure. The gate electrode extends away from a top surface of the metal gate structure and a top surface of the gate spacers.

In another aspect of the present disclosure, a semiconductor device is disclosed. The semiconductor device includes a semiconductor channel; gate spacers over the semiconductor channel; a metal gate structure, over the semiconductor channel, that is sandwiched by the gate spacers; and a gate electrode disposed above and in electrical contact with the metal gate structure. The gate electrode has at least one surface totally disposed above a top surface of the metal gate structure and a top surface of the gate spacers.

In yet another aspect of the present disclosure, a method for fabricating semiconductor devices is disclosed. The method includes forming a gate trench over a semiconductor channel, the gate trench being surrounded by gate spacers. The method includes sequentially depositing a work function metal, a glue metal, and an electrode metal in the gate trench. The method includes etching respective portions of the electrode metal and the glue metal to form a gate electrode above a metal gate structure. The metal gate structure includes a remaining portion of the work function metal and the gate electrode includes a remaining portion of the electrode metal. The gate electrode has an upper surface extending away from a top surface of the metal gate structure.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor fin;
gate spacers over the semiconductor fin;
a metal gate structure, over the semiconductor fin, that is sandwiched by the gate spacers; and
a gate electrode disposed above and in electrical contact with the metal gate structure;
wherein the gate electrode extends away from a top surface of the metal gate structure and a top surface of the gate spacers.

2. The semiconductor device of claim 1, wherein the gate electrode includes tungsten.

3. The semiconductor device of claim 1, further comprising a glue metal vertically disposed between a bottom surface of the gate electrode and the top surface of the metal gate structure.

4. The semiconductor device of claim 3, wherein the glue metal and the gate electrode have their respective sidewalls aligned with each other.

5. The semiconductor device of claim 4, wherein the respective sidewalls of the glue metal and the gate electrode are further aligned with inner sidewalls of the gate spacers.

6. The semiconductor device of claim 3, wherein the glue metal has a bottom surface positioned above the top surface of the gate spacers.

7. The semiconductor device of claim 1, further comprising a glue metal with its sidewalls and a bottom surface enclosed by the metal gate structure.

8. The semiconductor device of claim 7, wherein sidewalls of the glue metal are spaced from each other with a first distance and sidewalls of the gate electrode are spaced from each other with a second distance, and wherein the second distance is substantially similar to the first distance.

9. The semiconductor device of claim 7, wherein a top surface of the glue metal is positioned above the top surface of the metal gate structure.

10. A semiconductor device, comprising:
a semiconductor channel;
gate spacers over the semiconductor channel;
a metal gate structure, over the semiconductor channel, that is in contact with the gate spacers; and
a gate electrode disposed above and in electrical contact with the metal gate structure;
wherein the gate electrode extends away from a top surface of the metal gate structure and a top surface of the gate spacers.

11. The semiconductor device of claim 10, wherein the gate electrode consists essentially of tungsten.

12. The semiconductor device of claim 10, further comprising a glue metal between a bottom surface of the gate electrode and the top surface of the metal gate structure.

13. The semiconductor device of claim 12, wherein the glue metal and the gate electrode have coplanar sidewalls.

14. The semiconductor device of claim 13, wherein the coplanar sidewalls are further aligned with inner sidewalls of the gate spacers.

15. The semiconductor device of claim 12, wherein the glue metal has a bottom surface extending above the top surface of the gate spacers.

16. The semiconductor device of claim 10, further comprising a glue metal with its sidewalls and a bottom surface enclosed by the metal gate structure.

17. The semiconductor device of claim 16, wherein sidewalls of the glue metal are spaced from each other with a first distance and sidewalls of the gate electrode are spaced from each other with a second distance, and wherein the second distance is substantially similar to the first distance.

18. The semiconductor device of claim 16, wherein a top surface of the glue metal is positioned above the top surface of the metal gate structure.

19. The semiconductor device of claim 10, wherein the semiconductor channel is a fin extending from a semiconductive substrate.

20. A semiconductor device comprising:
gate spacers over a plurality of semiconductor fins;
a metal gate structure sandwiched by the gate spacers; and
a gate electrode disposed above and in electrical contact with the metal gate structure;
wherein the gate electrode extends away from a top surface of the metal gate structure and a top surface of the gate spacers.

* * * * *